(12) United States Patent
Higashi et al.

(10) Patent No.: US 9,644,268 B2
(45) Date of Patent: May 9, 2017

(54) THERMAL BRIDGE FOR CHEMICAL VAPOR DEPOSITION REACTORS

(75) Inventors: Gregg Higashi, San Jose, CA (US); Khurshed Sorabji, San Jose, CA (US); Andreas Hegedus, Burlingame, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 1001 days.

(21) Appl. No.: 13/222,984

(22) Filed: Aug. 31, 2011

(65) Prior Publication Data

US 2013/0047922 A1   Feb. 28, 2013

(51) Int. Cl.

| | |
|---|---|
| C23C 16/46 | (2006.01) |
| F27D 11/12 | (2006.01) |
| C23C 16/458 | (2006.01) |
| C23C 16/48 | (2006.01) |
| C23C 16/54 | (2006.01) |
| F27B 17/00 | (2006.01) |
| F27D 11/06 | (2006.01) |
| H01L 21/67 | (2006.01) |
| H01L 21/677 | (2006.01) |

(52) U.S. Cl.
CPC .......... *C23C 16/458* (2013.01); *C23C 16/483* (2013.01); *C23C 16/54* (2013.01); *F27B 17/0025* (2013.01); *F27D 11/06* (2013.01); *F27D 11/12* (2013.01); *H01L 21/6776* (2013.01); *H01L 21/67115* (2013.01); *H01L 21/67173* (2013.01); *H01L 21/67706* (2013.01)

(58) Field of Classification Search
CPC ................................................ H01L 21/67173

USPC ................ 118/718, 719; 156/345.31, 345.32
See application file for complete search history.

(56) References Cited

U.S. PATENT DOCUMENTS 8,008,174 B2    8/2011   He et al.
2004/0178176 A1*  9/2004   Dunn .................. C23C 16/4405
                                                216/58
(Continued)

FOREIGN PATENT DOCUMENTS

WO   WO2010107837 A2   9/2010
WO   WO2010107839 A2   9/2010
(Continued)

*Primary Examiner* — Parviz Hassanzadeh
*Assistant Examiner* — Nathan K Ford
(74) *Attorney, Agent, or Firm* — Arent Fox LLP (57) ABSTRACT

A thermal bridge connecting first and second processing zones and a method for transferring a work piece from a first to a second processing zone by way of the thermal bridge are disclosed. A work piece, transportable from the first to the second processing zone on or above the thermal bridge, is maintained at a temperature between the temperatures of the processing zones. The thermal bridge member features a thermally conductive transport member for the work piece supported over an infrared transmissive member that is insulative to heat conduction and convection. The bridge insulative member extends between the first and second processing zones or between reactors. An infrared radiation beam source emits infrared radiation which passes through the bridge insulative member to the transport member, heating the member. In an alternate embodiment, the transport member may be heated directly. A liner member may be mounted above the bridge member to retain heat.

17 Claims, 4 Drawing Sheets

(56) References Cited

U.S. PATENT DOCUMENTS

| | | |
|---|---|---|
| 2009/0324379 A1 | 12/2009 | He et al. |
| 2009/0325367 A1* | 12/2009 | He et al. .................. 438/507 |
| 2010/0092668 A1* | 4/2010 | Hegedus ............... C23C 16/301 |
| | | 427/255.28 |
| 2010/0206229 A1 | 8/2010 | He et al. |
| 2010/0206235 A1 | 8/2010 | He et al. |
| 2010/0209082 A1 | 8/2010 | He et al. |
| 2010/0209620 A1 | 8/2010 | He et al. |
| 2010/0209626 A1 | 8/2010 | He et al. |
| 2010/0212591 A1* | 8/2010 | He et al. .................. 118/715 |
| 2010/0229793 A1 | 9/2010 | He et al. |
| 2011/0268880 A1 | 11/2011 | Bour |
| 2012/0031333 A1* | 2/2012 | Kurita et al. ............. 118/719 |
| 2012/0225194 A1* | 9/2012 | Yudovsky .................. 427/58 |

FOREIGN PATENT DOCUMENTS

| | | |
|---|---|---|
| WO | WO2010107843 A2 | 9/2010 |
| WO | WO2010108835 A2 | 9/2010 |

* cited by examiner

THERMAL BRIDGE FOR CHEMICAL VAPOR DEPOSITION REACTORS

TECHNICAL FIELD

The field of the present invention relates to chemical vapor deposition reactors and more particularly to showerhead reactors.

BACKGROUND

Showerhead reactors are used for chemical vapor deposition and plasma etching in semiconductor processing. Many are a type of chemical vapor deposition reactor known as "cold wall" reactors. Walls of the reactor chamber, the showerhead which dispenses gases, and the chamber body are kept relatively cool (e.g. at ambient temperature or slightly above) in order to discourage outgassing from or chemical reactions on these components of the reactor. On the other hand, a semiconductor wafer, susceptor holding a thin-film, or other substrate or work piece (a.k.a. "workpiece") are heated inside the reactor as by a heated chuck or the like, in order to facilitate chemical vapor deposition reactions or etching at the work piece. When a work piece is moved within the reactor, such as for further processing or testing, the work piece can cool and deposition reactions will not be optimal.

When a semiconductor wafer, susceptor, substrate or other work piece is transferred from one showerhead reactor to a further showerhead reactor, such as for tandem sequential processing of the work piece, the work piece often cools somewhat and experiences a thermal dip. The work piece is then heated or reheated to a desired temperature in the further showerhead reactor and processing of the work piece continues. However, the thermal dip introduces undesirable effects. There can be a reduction in temperature uniformity of the wafer due to differential cooling. A reheated work piece with residual temperature variations can experience uneven deposition, particulate contamination, or uneven etching in the reactor. Semiconductor wafers can undergo a "potato chip" warpage. A thin-film being grown on a reusable susceptor can lift partially from or slip on the susceptor. It is an object of the invention to provide improved temperature uniformity of a work piece being transferred from one reactor to another reactor or from one modular section of a reactor to another modular section of a reactor.

SUMMARY

In order to maintain optimal CVD conditions in a modular showerhead reactor, a thermal bridge connects modular showerhead reactors and maintains a work piece at an elevated temperature appropriate for CVD or gas process reactions on the work piece as the work piece is transported across the bridge. If a first showerhead reactor is at a temperature T1 and a second reactor is at temperature T2, the thermal bridge is maintained at a temperature between T1 and T2 to minimize temperature variations.

The thermal bridge thermally and sometimes physically connects a first showerhead reactor module or processing zone to a second showerhead reactor module or processing zone. The thermal bridge includes a thermally conductive transport member, a thermally insulative member below the transport member and a heat source. A work piece is transported from the first showerhead processing zone to the second showerhead processing zone on or over the thermal bridge with showerheads fixed in place and not transported. While the insulative member is insulative relative to heat conduction and convection, it is transmissive of infrared radiation while not absorbing infrared. An infrared heat source is positioned to heat the bridge.

Thus, a bridge-connected modular showerhead reactor or processing zone allows continuous, sequential CVD processing of a work piece with fixed showerheads and movable work pieces. A first showerhead substrate processing zone has an exit and a first bridge member extending to a second showerhead substrate processing zone that has an entrance and a second bridge member connecting to the first bridge member. The bridge members are thermally conductive and infrared radiation absorptive. The two bridge members form a transport member for substrate carriers moving from one processing zone to the next.

The insulative member below the transport member is infrared-transmissive and has a lower thermal conductivity than the bridge member. The insulative member is mounted beneath each bridge member and can extend between the first substrate processing zone to the second. An infrared source is mounted within or near at least one of the first substrate processing zone and the second. The infrared source is directed to heat the underside of the transport member, by passing infrared radiation through the insulative member.

In terms of material CVD processing methodology for transferring a work piece from a first showerhead substrate processing zone to a second showerhead substrate processing zone, the first showerhead substrate processing zone is connected to the second showerhead substrate processing zone with a thermal bridge as described below. By passing infrared radiation from an infrared source through the insulative member to the transport member, a work piece is heated by the infrared radiation. The work piece is moved from the first showerhead substrate processing zone to the second showerhead substrate processing zone by way of the transport member. Between the first and second showerhead reactors, the work piece is maintained at a temperature between the CVD temperatures of adjacent reactors by the heated bridge member.

DETAILED DESCRIPTION

Figure 1:
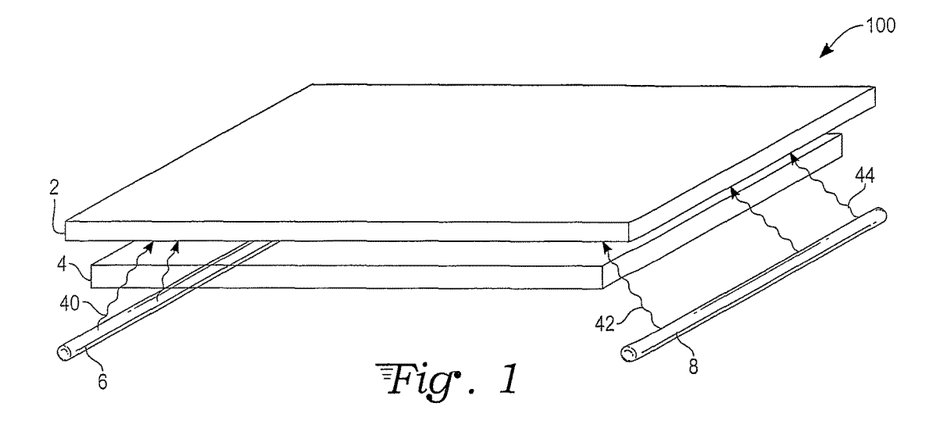
FIG. 1 is a perspective view of a thermal bridge for chemical vapor deposition reactors, in accordance with the present invention.
Figure 2:
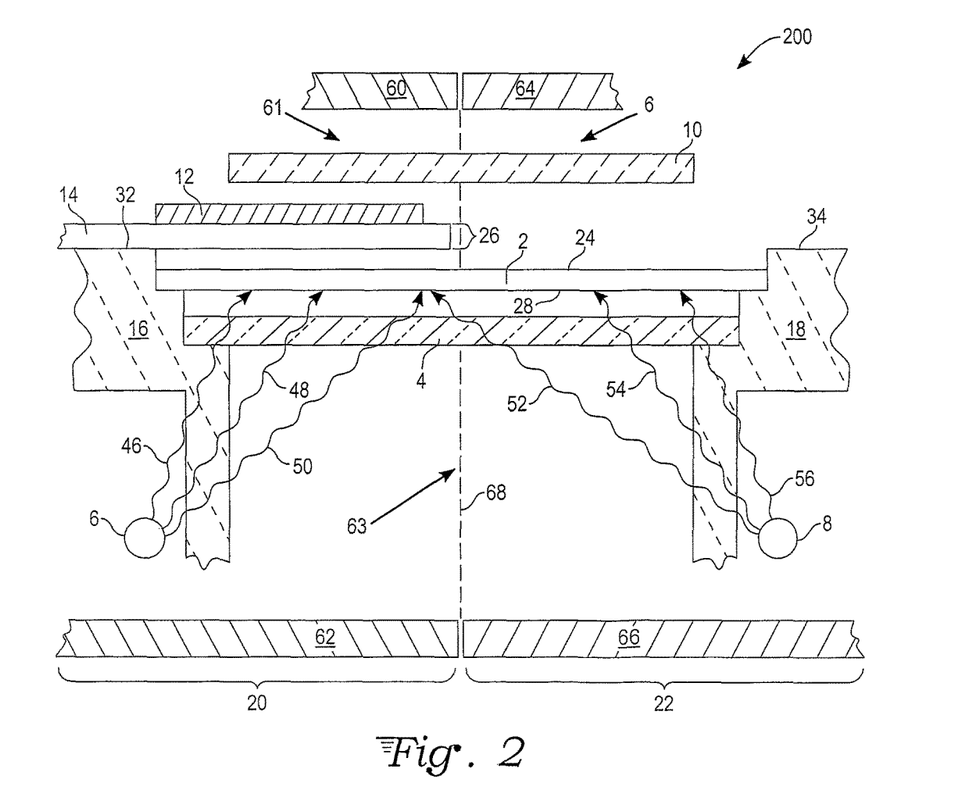
FIG. 2 is a cross-section view of a portion of a bridge-connected modular showerhead substrate processing zone, incorporating the thermal bridge of FIG. 1.

With reference to FIGS. 1 and 2, a thermal bridge 100 and a bridge-connected modular showerhead processing zone 200 are respectively shown. The thermal bridge 100, whose construction is described below, reduces the thermal dip occurring to a work piece 12 during transfer of the work piece 12 from a first showerhead substrate processing zone 20 to a second showerhead substrate processing zone 22. First showerhead substrate processing zone 20, second showerhead substrate processing zone 22 and the thermal bridge 100 connecting the first and second substrate processing zones form the bridge-connected modular showerhead reactor 200.

A method for transferring a work piece using the thermal bridge 100 will be discussed with reference to FIG. 3. Further examples of showerhead processing zones that can be connected with the thermal bridge 100 will be discussed with reference to FIGS. 4 and 5. Examples of arrangements of semiconductor substrates suitable for processing in a bridge-connected modular showerhead reactor will be discussed with reference to FIGS. 6-8, accompanied by a discussion of aspects of the thermal bridge 100 of FIG. 1 affected by the arrangements of substrates.

Returning to FIGS. 1 and 2, the thermal bridge 100 is shown as having a thermally conductive transport member 2, an insulative member 4 below the transport member and an infrared source in the form of a first lamp 6 and a second lamp 8. The lamps are preferably tubular or linear sources that generate and infrared beam that is parallel to the length or width direction of the transport member. Other infrared sources are readily devised. In an alternate embodiment, the insulative member can be replaced by a thermally conductive member having an integral heating element.

Returning to the first embodiment, infrared radiation beams 40, 42 and 44 in FIGS. 1 and 46, 48, 50, 52, 54 and 56 in FIG. 2 from the infrared source, i.e. first lamp 6 and/or second lamp 8, impinge on an underside 28 of the thermally conductive transport member 2 and are absorbed by the conductive transport member 2. Preferably the lamps are tubular, generating a linear infrared beam parallel to the transport member and the insulative member. Absorbing the infrared radiation heats the thermally laterally and areawise conductive transport member 2. In the alternate embodiment, the thermally conductive transport member 2 is heated by an electrical/resistive heater, an inductive heater, or a further heat source. The heated bridge member transfers heat to a carrier which then transfers heat to a substrate being transported across the bridge member 2, or the heated bridge member transfers heat directly to a substrate being transported without a carrier at a temperature between two connected substrate processing zones.

Thermally conductive transport member 2 is at least partially made of an infrared absorptive material that also has good thermal conductivity, so that thermal energy from absorbing the infrared radiation is conducted evenly throughout the thermally conductive transport member 2 and the thermally conductive transport member 2 maintains an even steady-state temperature when the substrate is below a showerhead, as well as when the substrate is between showerheads, with showerheads fixed in place. In various embodiments, the thermally conductive transport member 2 is made partially or wholly of a graphite-related material, although other materials may be devised. Suitable graphite-related materials for the thermally conductive transport member 2 include graphite, carbon fiber and fullerenes such as carbon nanotubes. The desired temperature for the transport member is a temperature above the temperature at which CVD or desired gas reactions occur, such as etching reactions.

Bridge insulative member 4 is made of an infrared radiation transmissive material, so that most of the infrared radiation from the infrared source passes through the bridge insulative member 4 and reaches the thermally conductive transport member 2. Bridge insulative member 4 further provides thermal insulation from the heated thermally conductive transport member 2, for portions of the bridge-connected reactor 200, such as the lower exit portion 62 of the first reactor 20 and the lower entrance portion 66 of the second reactor 22. Conductive heat and convective heat from the heated thermally conductive transport member 2 are blocked by the bridge insulator 4. In one embodiment, the bridge insulative member 4 is at least partially made of a material having a lower thermal conductivity than the thermally conductive transport member 2, so that conductive and convective heat from the heated thermally conductive transport member 2 are inefficiently conducted through the bridge insulative member 4 and physically blocked from convection by the placement and extent of the bridge insulative member 4. The placement is generally parallel, co-extensive and proximate to the thermally conductive transport member. In various embodiments, the bridge insulative member 4 is made partially or wholly of a quartz-related material, although other materials may be devised. Suitable quartz-related materials for the bridge insulative member 4 include quartz, fused quartz, silica and silicon dioxide.

In FIG. 2, a connection region 63 of the bridge-connected reactor 200, where the thermal bridge 100 is located, is shown as having upper exit portion 60 and lower exit portion 62 of the exit 61 of the first showerhead substrate processing zone 20 and as having upper entrance portion 64 and lower entrance portion 66 of the entrance 65 of the second showerhead substrate processing zone 22. A boundary between the first and second substrate processing zones 20 and 22, shown as a dashed line 68, indicates where the first and second substrate processing zones 20 and 22 are connected to form the bridge-connected substrate processing zone 200. Showerhead reactors are generally known, and other portions of the first and second showerhead substrate processing zones 20 and 22 such as the respective showerheads, chambers, chamber bodies, O-rings or other seals, clamps, gas lines, control systems etc. are not shown in the figures.

A semiconductor substrate or other work piece 12 is being transferred from the first showerhead substrate processing zone 20 to the second showerhead substrate processing zone 22 by way of the thermally conductive transport member 2, a part of a thermal bridge. The thermally conductive transport member 2 provides a pathway, such as an upper surface 24 of the thermally conductive transport member 2, on or above which the work piece 12 on a carrier member can be transported from the first showerhead substrate processing zone 20 to the second showerhead substrate processing zone 22. In various embodiments, the work piece 12 slides across the thermally conductive transport member 2, floats above the thermally conductive transport member 2 on a gas cushion, or is placed atop a substrate carrier 14 and the substrate carrier 14 rolls across the thermally conductive transport member 2. Showerheads are fixed in place but processing zones move between showerheads and between reactors.

In the embodiment shown in FIG. 2, an upper surface 24 of the thermally conductive transport member 2 aligns below an upper surface 32 of a first support member 16 of the first substrate processing zone 20 and aligns below an upper surface 34 of a second support member 18 of the second substrate processing zone 22. Such alignment can be arranged by suitably stepping the first and second support members 16 and 18 or by otherwise suitably positioning or mounting the thermally conductive transport member 2 relative to the first and second track members 16 and 18, as may be readily devised. As the substrate carrier 14 moves along the upper surface 32 of the first support member 16 and over to the upper surface 34 of the second support member 18, moving the work piece from the first showerhead substrate processing zone 20 to the second showerhead substrate processing zone 22, the substrate carrier 14 can maintain a spacing 26 from the substrate carrier 14 to the thermally conductive transport member 2. Both the substrate carrier 14 and the work piece 12 atop the substrate carrier 14 are prevented from physically contacting the thermally conductive transport member 2 by the maintenance of the spacing 26.

Depending upon the magnitude of the difference between a temperature of a silicon substrate or other work piece 12 and a temperature of the thermally conductive transport member 2, direct contact of the work piece 12 and the thermally conductive transport member 2 could result in a thermal shock of the work piece 12. Maintaining a spacing between the work piece 12 and the thermally conductive transport member 2, or a minimum spacing 26 from the substrate carrier 14 to the thermally conductive transport member 2, and thus disallowing contact between the work piece 12 and the thermally conductive transport member 2 or the substrate carrier 14 and the thermally conductive transport member 2 can prevent this thermal shock in the work piece 12.

In the embodiment shown in FIG. 2, a liner member 10 is mounted above the thermally conductive transport member 2. The liner member 10 further connects the first substrate processing zone 20 and the second substrate processing zone 22. The liner member 10 shields the upper exit portion 60 of the first substrate processing zone 20 and the upper entrance portion 64 of the second substrate processing zone 22 and/or other portions of the first and second reactors. Mountings for the liner member 10 are not shown and are readily devised. The liner member 10 shields the work piece 12 from stray particles or other contaminants or gases that may be found in the transition region between the first and second substrate processing zones 20 and 22, and shields portions of the first and second substrate processing zones 20 and 22 from reaction products or outgassing that may accompany the work piece 12 as the work piece is transported from the first substrate processing zone 20 to the second substrate processing zone 22. The liner member also serves to channel reactive gases and to retain heat near the reactive regions of the work piece.

In one embodiment, the liner member 10 further provides a thermal barrier in a manner related to the thermal insulation of the bridge insulator 4. Liner member 10 provides thermal insulation from the heated thermally conductive transport member 2, for portions of the bridge-connected reactor 200, such as the upper exit portion 60 of the first substrate processing zone 20 and the upper entrance portion 64 of the second substrate processing zone 22. Conductive heat and/or convective heat from the heated thermally conductive transport member 2 are blocked by the liner member 10. In one embodiment, the liner member 10 is at least partially made of a material having a lower thermal conductivity than the thermally conductive transport member 2, so that conductive and/or convective heat from the heated thermally conductive transport member 2 are inefficiently conducted through the liner member 10 and physically blocked from convection by the placement and extent of the liner member 10. In various embodiments, the liner member 10 is made partially or wholly of a quartz-related material, although other materials may be devised. Suitable quartz-related materials for the liner member 10 include quartz, fused quartz, silica and silicon dioxide.

Figure 3:
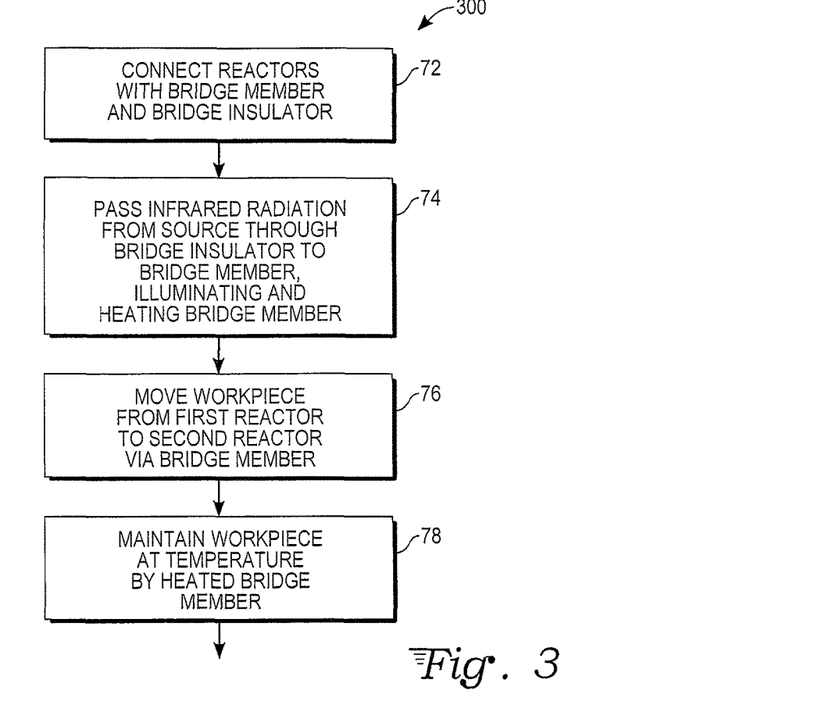
FIG. 3 is a flow diagram of a method for transferring a work piece from a first to a second showerhead substrate processing zone, using the thermal bridge of FIG. 1.

With reference to FIG. 3, a method 300 for transporting a work piece from a first showerhead substrate processing zone 20 to a second showerhead substrate processing zone 22 using the thermal bridge 100 is shown. The method is suitable for practice using the bridge-connected reactor 200.

In a first action 72 of the method, the substrate processing zones are connected with a thermally conductive transport member and a bridge insulator.

In a second action 74 of the method, infrared radiation is passed from a source through the bridge insulator to the thermally conductive transport member. The infrared radiation illuminates and heats the thermally conductive transport member and hence the substrate to a temperature between the processing zones that the substrate experiences minimal thermal change between processing zones.

In a third action 76 of the method, a work piece is moved from the first substrate processing zone to the second substrate processing zone. The work piece is moved via the thermally conductive transport member.

In a fourth action 78 of the method, the work piece is maintained at a temperature above ambient by the heated thermally conductive transport member.

Figure 4:
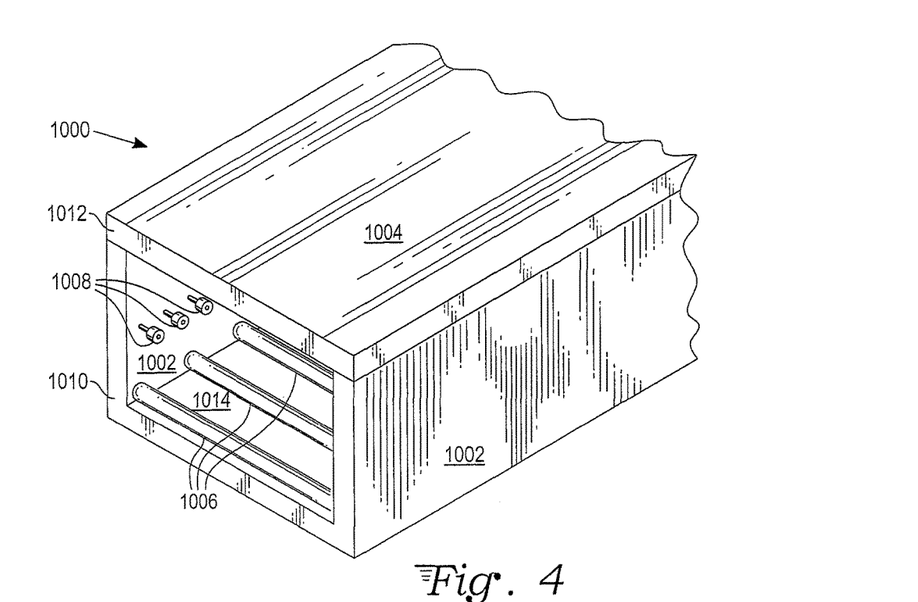
FIG. 4 is a perspective view of a portion of a showerhead substrate processing zone, suitable for using the thermal bridge of FIG. 1 in connecting to a further substrate processing zone.

With reference to FIG. 4, a showerhead processing zone 1000 can be used for processing one or more semiconductor wafers or other substrates, and can be connected to a further showerhead processing zone by the thermal bridge 100. One or more reaction or processing chambers, isolation zones, transit zones and/or other regions or zones are enclosed by the reactor walls 1002, reactor floor 1014 and reactor lid 1004. A roller assembly 1008 or other transport mechanism, such as sliders, moves wafers or other substrates, which may be on a substrate carrier, through the showerhead processing zone 1000. Heating units 1006, such as infrared lamps, electrical resistive heaters, inductive heating units or other heat sources as may be devised, can heat the wafers or other substrates directly or can heat the wafers or other substrates by heating the substrate carrier when such is used.

Figure 5:
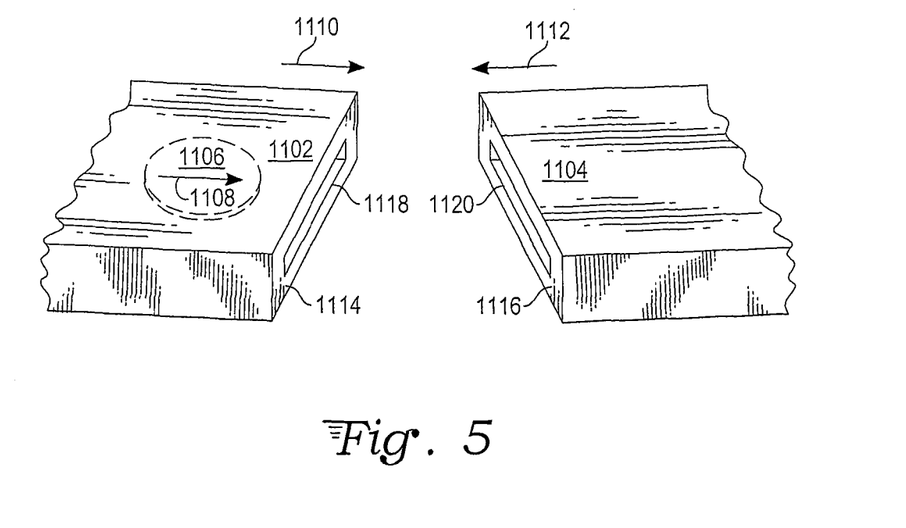
FIG. 5 is a perspective view of two showerhead reactors or two modules of a modular showerhead substrate processing zone, which can be connected using the thermal bridge of FIG. 1 to form a variation of the bridge-connected modular showerhead substrate processing zone of FIG. 2.

With reference to FIG. 5, a semiconductor wafer 1106 or other substrate can be processed in a first showerhead processing zone 1102 and subsequently processed in a second showerhead processing zone 1104. The wafer 1106 can be moved in a forward direction 1108 and transferred out of an exit 1118 of the first showerhead processing zone 1102, then transferred into an entrance 1120 of a second showerhead processing zone 1104, all on thermal bridges of the type described below in FIGS. 6-8.

In a modular showerhead reactor, the first showerhead processing zone 1102 is a showerhead module and the second showerhead processing zone 1104 is a further showerhead reactor module, which can be the of the same or of differing construction and characteristics. In one embodiment of a modular showerhead reactor, the first and second showerhead processing zones 1102, 1104 are modules and are moved in directions 1110, 1112 toward each other. The thermal bridge 100 of FIG. 1 connects the first and second showerhead processing zones 1102, 1104. The exit face 1114 of the first showerhead processing zone 1102 is fastened to the entrance face 1116 of the second showerhead processing zone 1104 with appropriate hardware and sealing. A substrate can pass directly from the first showerhead processing zone 1102 to the second showerhead processing zone 1104 by way of the thermal bridge 100 of FIG. 1.

Figure 6:
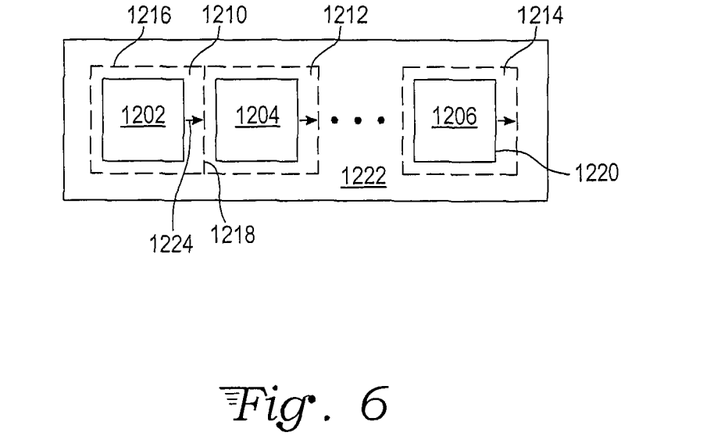
FIG. 6 is a top plan view of semiconductor substrates being processed in series in showerhead substrate processing zone with bridge-connected transport.
Figure 7:
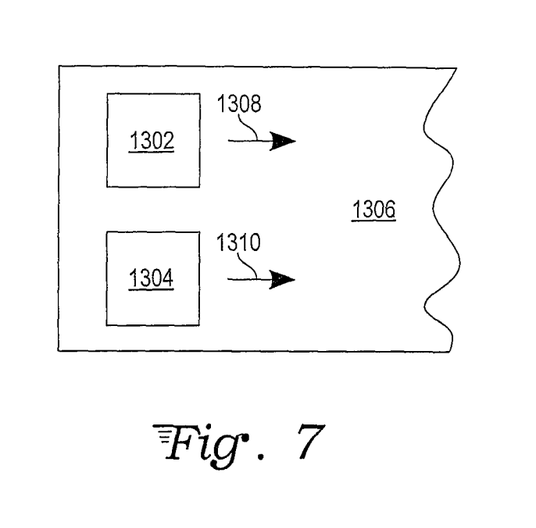
FIG. 7 is a top plan view of semiconductor substrates being processed in parallel in showerhead substrate processing zones with bridge-connected transport.
Figure 8:
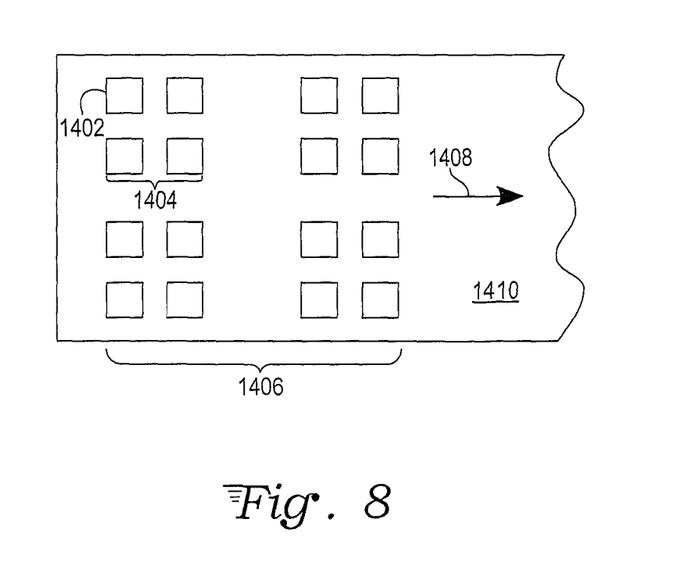
FIG. 8 is a top plan view of groups of semiconductor substrates being processed in parallel in showerhead substrate processing zones with bridge-connected transport.

With reference to FIGS. 6-8, various parallel and series bridge arrangements are shown for processing one or more semiconductor wafers or semiconductor substrates in a showerhead reactor. In FIG. 6, wafers 1202, 1204 and 1206 or semiconductor substrates are processed in series in the bridge-connected modular showerhead processing zone 200 of FIG. 2, the showerhead processing zone 1000 of FIG. 4, the modular showerhead reactor formed by connecting processing zones 1102 and 1104 with the thermal bridge 100. Each processing zone 1210, 1212, 1214 is surrounded by a protection zone as provided by a perimeter protection zone 1216 and an inter-substrate protection zone 1218 or an individual perimeter protection zone 1220, with each protection zone providing a gas isolation curtain, an exhaust or both. Each wafer 1202 moves in a forward linear direction 1224 from one processing region 1210 to another processing zone 1212 along a path 1222 from an entrance of the reactor to an exit of the reactor along a thermal bridge as disclosed herein. Note that showerheads are fixed but the processing zone moves beneath a showerhead on rollers or other sliders.

In FIG. 7, two wafers 1302 and 1304 or other substrates are processed and move in a forward direction 1308, 1310 in parallel along a path 1306 through the bridge-connected modular showerhead reactor 200 of FIG. 2, the showerhead reactor 1000, the modular showerhead reactor formed by connecting reactors 1102 and 1104 with the thermal bridge 100 of FIG. 1. Dimensions of the reactor and dimensions or arrangements of the thermal bridge are formed accordingly.

In FIG. 8, a plurality of wafers 1402 or semiconductor substrates are processed and move in a forward direction 1408 in parallel along a path 1410 through the bridge-connected modular showerhead reactor 200 of FIG. 2, the showerhead reactor 1000 of FIG. 4, the modular showerhead reactor formed by connecting processing zones 1102 and 1104 with the thermal bridge 100, dimensioned accordingly. The plurality of wafers or substrates 1402 is shown as an array of tiles, grouped such that a fixed array of showerhead tiles is a fixed array of groups of showerhead tiles. A group 1406 of wafers is an array of four groups 1404 of wafers. Each group 1404 has four wafers 1402. As an example, after the sixteen wafers 1402 in the group 1406 are processed in a reaction or processing zone, the wafers are moved to a subsequent reaction or processing zone beneath the fixed showerheads or are moved from one modular reactor to another modular reactor over the thermal bridge 100 of FIG. 1, and further processed under similar or differing gases and conditions.

The thermal bridge 100 of FIG. 1 can be widened so that two or more wafers can proceed across the thermal bridge in parallel or so that a substrate carrier holding multiple wafers can proceed across the thermal bridge. The thermal bridge 100 can be provided with a gas cushion so as to float wafers or a wafer carrier across the bridge. Two or more thermal bridges 100 can be provided side-by-side so that wafers can cross or jump between modular reactors. One or more thermal bridges can be provided with rollers or sliders or another transport mechanism so as to move wafers, substrates, substrate holders carrying substrates and so on from one modular reactor to a further modular reactor.

The disclosed thermal bridge 100, bridge-connected modular showerhead reactor 200 and method 300 provide improved temperature uniformity of a work piece being transferred from one reactor to another reactor at the same or different temperatures or from one modular section of a reactor to another modular section of a reactor. The heated bridge member maintains the work piece at a more even temperature than does a known transfer of a work piece from one reactor to another without such a heated bridge.

What is claimed is:

1. A thermal bridge, connecting a first processing zone to a second processing zone, the first and second processing zones being fixed and emitting gases that chemically react on a work piece at a characteristic temperature, comprising:

a carrier member on which a work piece is disposed, the carrier member arranged for moving the work piece from the first processing zone to the second processing zone;

a thermally conductive transport member disposed beneath the carrier member and providing a pathway on or above which the carrier member and the work piece are transported between the first and second processing zones;

wherein the thermally conductive transport member comprises a graphite material;

at least one heat source positioned to heat the thermally conductive transport member during movement of the carrier member and the work piece between the first and second processing zones to a temperature between processing zone temperatures of the first and second processing zones; and a thermally insulative member providing passage of infrared radiation through the thermally insulative member and providing a physical barrier to convective or conductive heat transmission, wherein the thermally insulative member has a lower thermal conductivity than the thermally conductive transport member, and wherein each of the thermally conductive transport member and the thermally insulative member is partially disposed inside a work piece exit of the first processing zone and partially disposed inside a work piece entrance of the second processing zone, wherein the exit of the first processing zone includes a first support member and the entrance of the second processing zone includes a second support member, and wherein the thermally conductive transport member and the thermally insulative member are supported by both the first support member and the second support member.

2. The thermal bridge of claim 1 wherein the thermally insulative member comprises optically transmissive material.

3. The thermal bridge of claim 1 wherein the heat source includes a first infrared source mounted in the first processing zone and a second infrared source mounted in the second processing zone.

4. The thermal bridge of claim 1 wherein the heat source includes at least one infrared lamp directing an infrared beam onto the transport member.

5. The thermal bridge of claim 1 wherein the thermally conductive transport member is positioned by rollers such that a substrate carrier holding the work piece is movable from the first processing zone to the second processing zone above the thermally conductive transport member.

6. The thermal bridge of claim 1 further comprising a heat retaining bridge liner.

7. A chemical vapor deposition system comprising:
a first processing zone having a work piece exit and a first sliding or rolling member for the work piece;
a second processing zone having a work piece entrance and a second sliding or rolling member for the work piece, the processing zones emitting gases that react on the work piece at characteristic temperatures;
a carrier member on which the work piece is disposed, the carrier member arranged for moving the work piece from the first processing zone to the second processing zone;
a thermally conductive, infrared radiation absorptive transport member connecting to the first sliding or rolling member at the exit of the first processing zone and connecting to the second sliding or rolling member at the entrance of the second processing zone, the thermally conductive, infrared radiation absorptive transport member disposed beneath the carrier member and providing a pathway on or above which the carrier member and the work piece are transported between the first and second processing zones;
wherein the thermally conductive, infrared radiation absorptive transport member comprises a graphite material;
an infrared-transmissive insulative member of a lower thermal conductivity than the thermally conductive, infrared radiation absorptive transport member, mounted beneath the transport member in a parallel plane and connecting the first processing zone to the second processing zone;
a liner member mounted above the carrier member, the thermally conductive, infrared radiation absorptive transport member and the infrared-transmissive insulative member and connecting the first processing zone to the second processing zone; and
an infrared source mounted to at least one of the first processing zone and the second processing zone and directed to heat an underside of the transport member above a gas reactive characteristic temperature by passing infrared radiation through the insulative member,
wherein each of the thermally conductive, infrared radiation absorptive transport member and the infrared-transmissive insulative member is partially disposed inside the exit of the first processing zone and partially disposed inside the entrance of the second processing zone,
wherein the exit of the first processing zone includes a first support member and the entrance of the second processing zone includes a second support member, and
wherein the thermally conductive, infrared radiation absorptive transport member and the infrared-transmissive insulative member are supported by both the first support member and the second support member.

8. The chemical vapor deposition system of claim 7 wherein the infrared source includes a first infrared source mounted to the first processing zone and below the transport member and a second infrared source mounted to the second processing zone and below the transport member.

9. The chemical vapor deposition system of claim 8 wherein the first infrared source includes at least one lamp and the second infrared source includes at least one lamp.

10. The chemical vapor deposition system of claim 7 wherein the insulative member is mounted to a portion of the first sliding or rolling member and to a portion of the second sliding or rolling member, the first sliding or rolling member and the second sliding or rolling member being made of an infrared-transmissive material.

11. The chemical vapor deposition system of claim 7 wherein the insulative member is made at least partially of at least one of quartz, fused quartz, a quartz-based material, silica, or silicon dioxide.

12. The chemical vapor deposition system of claim 7 wherein the liner member is made at least partially of at least one of quartz, fused quartz, a quartz-based material, silica, or silicon dioxide.

13. The chemical vapor deposition system of claim 7 wherein an upper surface of the transport member aligns to a surface of the first sliding or rolling member and to a surface of the second sliding or rolling member.

14. A method for transferring a work piece from a first processing zone to a second processing zone, comprising:
connecting the first processing zone to the second processing zone with a thermally conductive transport member and a parallel insulative member transmissive of infrared radiation, the processing zones emitting reactive gases at characteristic temperatures;
wherein the transport member comprises a graphite material,
wherein the insulative member has a lower thermal conductivity than the transport member,
heating the transport member to at least the characteristic temperature with infrared radiation by passing the infrared radiation from an infrared source through the insulative member to the transport member; and
moving the work piece from the first processing zone to the second processing zone by way of the transport member,
wherein a work piece exit of the first processing zone includes a first support member and a work piece entrance of the second processing zone includes a second support member,
wherein the transport member and the insulative member are supported by both the first support member and the second support member, and
wherein the transport member is disposed beneath the work piece and provides a pathway on or above which the work piece is transported between the first processing zone and the second processing zone.

15. The method of claim 14 wherein moving the work piece includes placing the work piece atop a substrate carrier and moving the substrate carrier from the first processing zone to the second processing zone by way of the transport member.

16. The method of claim 14 wherein heating the transport member comprises directing a linear infrared beam onto the transport member.

17. The method of claim 14 further comprising thermally shielding a portion of the first and second reactors with a bridge liner.

* * * * *